United States Patent [19]

Fujieda et al.

[11] Patent Number: 5,252,639
[45] Date of Patent: Oct. 12, 1993

[54] MOLDING RESIN COMPOSITION AND MOLDED ELECTRONIC COMPONENT

[75] Inventors: Shinetsu Fujieda, Kawasaki; Akira Yoshizumi; Kazutaka Matsumoto, both of Yokohama; Hisayuki Hirai, Chiba, all of Japan

[73] Assignee: Kabushiki Kaisha Toshiba, Kawasaki, Japan

[21] Appl. No.: 796,896

[22] Filed: Nov. 25, 1991

Related U.S. Application Data

[63] Continuation of Ser. No. 590,042, Sep. 28, 1990, abandoned, which is a continuation of Ser. No. 349,971, May 8, 1989, abandoned, which is a continuation of Ser. No. 122,745, Nov. 19, 1987, abandoned.

[30] Foreign Application Priority Data

Nov. 21, 1986 [JP] Japan .................................. 61-276635

[51] Int. Cl.$^5$ .............................................. C08K 5/09
[52] U.S. Cl. ..................................... 523/455; 523/456; 524/275; 524/277; 524/279; 524/322; 524/487
[58] Field of Search ................ 523/455, 456; 524/275, 524/277, 278, 322, 487

[56] References Cited

U.S. PATENT DOCUMENTS

| | | | |
|---|---|---|---|
| 3,624,032 | 11/1971 | Miyashiro et al. | 260/47 EQ |
| 3,812,214 | 4/1974 | Markovitz | 260/830 TN |
| 4,552,907 | 11/1985 | Sato et al. | 523/456 |
| 4,719,255 | 1/1988 | Yoshizumi et al. | 523/436 |

FOREIGN PATENT DOCUMENTS 1372884 3/1956 Japan .

*Primary Examiner*—Paul R. Michl
*Assistant Examiner*—Edward J. Cain
*Attorney, Agent, or Firm*—Oblon, Spivak, McClelland, Maier & Neustadt

[57] ABSTRACT

The molding resin composition of this invention comprises a resin contained a releasing a agents formulated with a release agent and a metal chelate compound.

This resin composition is improved an good adhesivity, high moisture resistivity and a good moldability.

12 Claims, No Drawings

MOLDING RESIN COMPOSITION AND MOLDED ELECTRONIC COMPONENT

This application is a continuation of application Ser. No. 07/590,042, filed on Sep. 28, 1990 which was a continuation of Ser. No. 07/349,971 filed on May 8, 1989 which was a continuation of Ser. No. 07/122,745 filed on Nov. 19, 1987; now all abandoned.

BACKGROUND OF THE INVENTION

This invention relates to molding resins and more specifically to molding resin compositions which provide good moldability and strong adhesive properties with a respect to a lead frame or a semiconductor chip, or the like. This invention also provides cured products having high humidity resistance in electronic components, for example semiconductor devices, after the devices are dipped into molten solder.

Recently, in the field of molding of semiconductor devices, the number of functional units on a semiconductor chip has been greatly increased, and rapid progress has been made in the high density integration of semiconductor chips.

More recently, surface mounting has become more popular. A molding material used in such devices must have a high resistance to humidity after the device has been dipped into molten solder at a high temperature (260° C.) for several seconds. Conventional molding resins do not meet the current requirements for thermal resistance and thermal shock resistance on account of the high integration of the semiconductor devices. In the prior art, an epoxy resin typically was used as a molding resin for semiconductor encapsulation. In particular, epoxy resin cured with a phenol novolac resin is the most common molding resin currently in used due to its excellent humidity resistance, and its high temperature electronic characteristics and moldability.

However, this conventional epoxy resin has some problems. With this resin, cracks are often generated in a phosphorus silicate glass film (PSG) or a silicon nitride film (SiN) used to cover the surface and protect the aluminium pattern of the semiconductor element from moisture penetration, and cracks may be generated in the semiconductor chip itself. This cracking tendency frequently appears during thermal cycle test of the devices.

As a result, failures based on chip cracking or corrosion of the aluminium pattern due to cracking of the protecting film occur. Cracks often generate on the boundary between the semiconductor chip or lead frame and the molding resin after the semiconductor device is dipped into molten solder at about 260° C. This causes the device to failure or operate unproperly.

To overcome the above problems, it is necessary that the stress on the inner enclosure of the molding resin is decreased and the adhesivity between lead frame and the glass film, e.g., PSG or SiN film on the surface of the element, must be increased. Also the hydrolizable halogen compounds in the cured product must be reduced and water absorption from the atmosphere must be decreased to protect against corrosion of the aluminium pattern on the surface of the semiconductor element. It is an important that the concentration of chloride is reduced and that the electric isolation efficiency is maintained at a high level even in environments high humidity or high temperature.

A modification method has been proposed in which the following elements are used for the epoxy molding resin cured by the phenol novolac resin to provide low stress. These elements include a terminated liquid rubber (disclosed in Japanese laid open application No. 57-42720), an epoxy modified butadiene copolymer (disclosed in Japanese laid open application No. 57-120), an alkyl phenol modified phenol novolac epoxy resin (disclosed in Japanese laid open application No. 59-30820), a siloxane modified phenol novolac epoxy resin (disclosed in Japanese laid open application No. 58-21417 and 58-34825), and a crosslinked organo siloxane copolymer powder (disclosed in Japanese laid open application No. 58-219218).

However, these compositions do not provide the necessary high adhesive properties for sealing the lead frame to the other elements of the device. As a result, these materials do not provide the necessary humidity protection. After the molded element is dipped in the molten solder, the humidity penetrates into the molded element. Generally, during the low stress method of making a resin composition, the viscosity of the resin added to the low stress agent increases in the molten state. As a result, many problems are generated. For example, the inner wiring of the device may change position or meet, or the arrangement way deteriorate.

SUMMARY OF THE INVENTION

It is object of this invention to provide a new and improved unique molding resin composition having an excellent adhesivity, a low hygroscopic property and a good formability. In accordance with the above object, the molding resin composition of this invention comprises a resin base, an inner release agent and a metal chelate compound.

DETAILED DESCRIPTION OF THE PREFERRED EMBODIMENTS

This invention provides a molding resin composition included a inner release agent combined a metal chelate compound. It is especially useful to use at least one of zirconium chelate, titan chelate, and aluminium chelate.

Inner release agents used in this invention may include hydrocarbon wax, fatty acid wax, fatty acid amide wax and ester wax. Ester waxes in particular, e.g., calnava wax and montan wax, are preferred in view of their resistance to humidity. Other preferred agents include long chained carboxylic acids, e.g., stearic acid, palmitic acid, zinc stearate, calcium stearate, and metal salts of these compounds, low molecular value polyethylene wax, and combinations thereof.

Metal chelate compounds used in this invention are selected from zirconium chelate, titanium chelate and aluminium chelate. The zirconium chelate is preferably one of the following compounds:
zirconiumtetraxyacetylacetonate,
zirconiummonobutoxytriacetylacetonate,
zirconiumdebutoxybisacetylacetonate,
zirconiumtributoxyacetylacetonate,
zirconiumtetraxyetylacetylacetate,
zirconiumbutoxytrietylacelylacetate,
zirconiumbutoxytriethylacelylacetate,
zirconiumbutoxybisetylacelylacetate,
zirconiumtributoxymonoetylacetylacetate,
zirconiumtetraxyetyllactate,
zirconiumdebutoxybisetyllactate,
zirconiumbisacetylacetnatobisetylacetylacetonate,
zirconiummonoacetylacetonatotrietylacetylacetonate, zirconium-
 monoacetylacetonatobisetylacetylacetynatobutoxy,
 and
zirconiumbisacetylacetonatobisetyllactonato.

It is preferred that the titanium chelate compounds and the aluminium chelate compounds come from those having the following ligans, e.g., β-diketone, hydroxycarbocylic acid, ketoester, ketoalchol and glycol.

Of the above-mentioned metal chelate compounds, the zirconium chelate compounds are especially preferred from the point of view of resistance to humidity and compatibility. It is preferred that the inner release agent and the metal chelate compound be precombined to give a melting temperature higher than the melting temperature of the inner release agent. As a result, a homogeneously melting state can be obtained with the combination.

Preferably, the ratio of the mixture of the metal chelate and compound to the inner release agent is from 0.1% to 50% by weight, and, more preferably, from 0.5% to 30% by weight.

The ratio of the mixture of the metal chelate compound and the inner release agent to the entire molding resin composition is in a range from 0.01% to 3% by weight, and more preferably, from 0.1% to 1% by weight. If the ratio is too high adequate humidity resistance cannot be obtained, and if it is too low, the releasing ability of the mold drops.

When the molding resin composition of this invention is applied to epoxy resin composition for semiconductor encapsulation, the main agents are epoxy resin, the inner release agent, a hardening agent, a hardening catalytic agent and a flame retarder. Inorganic fillers, surface treatment agents for the filler and the coloring agents may be added. Some types of low stress applying agents are also used as additives.

Typical manufacturing methods for the molding resin of this invention include melt kneading using a thermal roll, a kneader or a extruder, and mixing after fine pulverization using a special mixing machine.

A semiconductor device encapsulated with the resin compositions of this invention can be easily made in the conventional manner.

The most common molding method is a low pressure transfer molding process, and other methods include, an injection molding method, a compression molding method and a potting method. The epoxy resin is cured by heating during molding, and the resin encapsulated semiconductor device is obtained. A curing temperature of at least 150° C.

This invention will be explained in more detail using the following examples, and comparative examples.

EXAMPLE 1

Fused silica (made by Toshiba Ceramics) 72 parts by weight, antimony trioxide, 2.0 parts by weight, and γ-grisidoxypropyltrimethoxysilane A-187 (made by Japan Unicar) 0.4 parts by weight as coupling agent, were combined by the Henchel mixer. Next, an orthocresol novolac resin (made by Sumitomo Chemical ESCN-195XL) 16 parts by weight, a phenolnovolac resin (made by Showa Union BRG-558) 8 parts by weight, a bromine epoxy resin, 2 parts by weight, triphenylphosphine, 0.2 parts by weight, and carbon powder, 0.3 parts by weight, hardening accelerators and an inner release agent, 0.3 parts by weight, described in Table 1, were combined. The combined compounds were kneaded by two axes rolls at 70°~100° C. and thereafter the kneaded compounds were cooled. These compounds were crushed and formed into tablets. As a result, the epoxy resin of this invention for encapsulation of a semiconductor device was obtained.

EXAMPLES 2 THROUGH 8

In each example, resin was made using the same combining compounds and method of above mentioned example, except that the inner release agent was varied in accordance with Table 1.

EXAMPLE 9

Poly(phenylmethylene)polymaleimide resin M-20 (made by Mitsui Toatsu) 16.7 parts by weight, a phenolnovolac epoxy resin Ep-152 (made by Oil Shell Epoxy) 7 parts by weight, a phenolnovolac resin BRG-555 (made by Showa-High Molecular) 4.2 parts by weight, triphenylphosphine 0.28 parts by weight, fused silica powder GR-80 (made by Toshiba Ceramics) 70.7 parts by weight, carbon powder 0.3 parts by weight, an epoxy silane coupling agent A-187 (made by Japan Unicar) 0.4 parts by weight and a release agent 0.8 parts by weight, were combined. The combined compounds were kneaded by two axes rolls at 70°~100° C. and thereafter the kneaded compounds were cooled. These compounds were crushed and formed into tablets. As a result, the epoxy resin of this invention for encapsulation of the semiconductor device was obtained.

TABLE 1

| | EXAMPLES | | | | | |
|---|---|---|---|---|---|---|
| | 1 | 2 | 3 | 4 | 5 | 6 |
| CALNAVA WAX (NIKKO FINE PRODUCTS) | 0.297 | 0.294 | 0.285 | 0.270 | 0.294 | 0.294 |
| POLYETHYLANE WAX HW-4252E (MITSUI PETROCHEMICAL INDUSTRIES LTD) | | | | | | |
| ZIRCONIUMTETRAKISACETYLACETO | 0.003 | 0.006 | 0.015 | 0.03 | | |
| ZIRCONIUMMONOBUTOXYTRIEACETYLACETO | | | | | 0.006 | |
| ZIRCONIUMDIBUTOXYBISACETYLACETONA | | | | | | 0.006 |
| ZIRCONIUMTETRAACETYLACETATE | | | | | | |
| ZIRCONIUMMONOBISETHYLACETYLACETATE | | | | | | |
| SOLBILITY | ○ | ○ | ○ | ○ | ○ | Δ |
| VOLUME RESISTIVITY 150° C. [Ω·cm] | $1.0 \times 10^{14}$ | $1.5 \times 10^{14}$ | $2.0 \times 10^{14}$ | $2.0 \times 10^{14}$ | $1.5 \times 10^{14}$ | $1.0 \times 10^{14}$ |
| GLASS TRANSITION TEMP. [°C.] | 165 | 165 | 165 | 168 | 162 | 160 |
| THERMAL EXPANSION COEFF. $\alpha 1 \times 10^{-6}$ [deg$^{-1}$] | 1.8 | 1.87 | 1.7 | 1.7 | 1.8 | 1.9 |
| FLEXURAL STRENGTH [Kg/mm$^2$] | 16.1 | 16.3 | 16.1 | 16.3 | 15.2 | 14.3 |
| PRESSURE COOKER (2.5 AIR PRS.) TEST 168 Hrs. WATER ABSORPT. RATIO (%) | 0.70 | 0.71 | 0.70 | 0.72 | 0.81 | 0.83 |
| PRESSURE COOKER RED INK TEST 8 Hrs. (mm) | 0.8 | 0 | 0 | 0.1 | 0.3 | 1.2 |
| DIPPING INTO MOLTEN SOLDER | 0.6 | 0.1 | 0.4 | 0.3 | 1.0 | 1.2 |

TABLE 1-continued

| | | | | COMPARING EXAMPLES | |
|---|---|---|---|---|---|
| | 7 | 8 | 9 | 1 | 2 |
| CALNAVA WAX (NIKKO FINE PRODUCTS) | | 0.210 | 0.084 | 0.3 | 0.297 |
| POLYETHYLANE WAX HW-4252E (MITSUI PETROCHEMICAL INDUSTRIES LTD) | 0.270 | | 0.70 | | |
| ZIRCONIUMTETRAKISACETYLACETO | | | | | |
| ZIRCONIUMMONOBUTOXYTRIEACETYLACETO | | | | | |
| ZIRCONIUMDIBUTOXYBISACETYLACETONA | | | 0.016 | | 0.003 |
| ZIRCONIUMTETRAACETYLACETATE | 0.03 | | | | |
| ZIRCONIUMMONOBISETHYLACETYLACETATE | | 0.09 | | | ! |
| SOLBILITY | ○ | ○ | ○ | — | — |
| VOLUME RESISTIVITY 150° C. [Ω · cm] | $0.9 \times 10^{14}$ | $0.5 \times 10^{14}$ | $3.0 \times 10^{14}$ | $1.0 \times 10^{14}$ | $0.9 \times 10^{14}$ |
| GLASS TRANSITION TEMP. [°C.] | 159 | 155 | 198 | 165 | 153 |
| THERMAL EXPANSION COEFF. $\alpha 1 \times 10^{-6}$ [deg$^{-1}$] | 1.7 | 1.7 | 1.4 | 1.9 | 1.9 |
| FLEXURAL STRENGTH [Kg/mm$^2$] | 15.7 | 14.0 | 14.7 | 15.0 | 14.8 |
| PRESSURE COOKER (2.5 AIR PRS.) TEST 168 Hrs. WATER ABSORPT. RATIO (%) | 0.73 | 0.89 | 1.1 | 0.95 | 0.93 |
| PRESSURE COOKER RED INK TEST 8 Hrs. (mm) | 0.3 | 1.5 | 1.9 | 3.0 | 3.2 |
| DIPPING INTO MOLTEN SOLDER RED INK TEST 2 Hrs. (mm) | 0.4 | 1.0 | 2.1 | INVADED UNTIL CHIP | 5.5 |
| DIP16 PINS MOLDABILITY | ○ | Δ | ○ | ○ | ○ |

COMPARATIVE EXAMPLE 1

This comparative example did not include the inner release agent, and included 0.3 parts by weight of calnava wax. The process of manufacturing was same as in the above mentioned process of Example 1.

COMPARATIVE EXAMPLE 2

The inner release agent used in this comparative example was not precombined, calnava wax was the same weight as the inner release agent described in the above mentioned example 1 and zirconium chelate was used. Other compounds and manufacturing methods were the same as in the above mentioned examples.

The combining method for the inner release agent and the metal chelate compound used in examples 1 through 9 described in the Table 1 was as follows. First, the inner release agent at a prescribed weight was molten into a separable flask and the metal chelate compound was combined and stirred into the molten inner release agent at 120° C.±5° C. Both compounds were stirred up about 30 minutes. After the confirmation of the complete melting state of the metal chelate into the inner release agent, the mixture was poured into a stainless steel bat. It was cooled to room temperature and thereafter ground to obtain the inner release agent of this invention was obtained.

The contents of the inner release agent and the metal chelate included in molding materials used in examples and comparative examples, are shown in Table 1.

Each example was carried out using a metal mold for a DIP type 16 pins IC for test pieces of 3 mm$^2$. Each test piece was cured for 8 hours at 175° C., and tested.

Pressure cooker test: The main tests included red ink tests, namely, DIP type 16 pins molded pieces were entered into a pressure cooker at 2.5 atm. filled with red ink and the penetrating distance of the red ink around the leads was measured after 8 hours.

Solder dip test: DIP type 16 pins molded pieces were dipped into molten solder at 260° C. for 20 seconds, and were thereafter tested with the pressure cooker red ink test for 2 hours.

It is obvious from the results of Table 1, that the effects of the improved inner release agent of this invention are better than in the comparative examples. The penetration of the red ink is prevented as shown by the results of the red ink tests. Accordingly, the humidity resistance is excellent without the loss of formability.

This invention contributes to improve the thermal shock, the humidity resistance, and the wiring density, all of which are desired for high density integration of many kinds of electronic components.

What is claimed is:

1. A molding resin composition, comprising a resin base, a release agent and a zirconium chelate compound, wherein the release agent and the zirconium chelate compound are precombined.

2. The composition of claim 1, wherein the release agent is wax.

3. The composition of claim 1, wherein the resin base includes one of epoxy resin and polyimide resin.

4. The composition of claim 1, wherein the metal chelate compound includes at least one compound selected from the group consisting of zirconium chelate, titanium chelate and aluminium chelate.

5. The composition of claim 1, wherein the release agent includes at least one agent selected from the group consisting of hydrocarbon wax, fatty acid wax, fatty acid amide wax and ester wax.

6. The composition of claim 1, wherein the ratio of the metal chelate compound to the release agent is from about 0.5% to about 30% by weight.

7. The composition of claim 5, wherein the release agent includes at least one of a carnauba wax and a montan wax.

8. The composition of claim 1, wherein the release agent includes a long chain carboxylic acid.

9. The composition of claim 8, wherein the release agent includes at least one compound selected from the group consisting of stearic acid, palmitic acid, zinc stearate, calcium stearate, metal salts thereof, and low molecular value polyetylene wax.

10. The composition of claim 6, wherein the ratio of the combination of the inner release agent and the metal chelate compound to the resin base is about 0.1 to about 1% by weight.

11. The composition of claim 1, wherein the zirconium chelate compound is zirconium tetroxyacetylacetonate, zirconium monobutoxytriacetylacetonate, zirconium debutoxybisacetylacetonate, zirconium tributoxyacetylacetonate, zirconium tetroxyethylacetylacetonate, zirconium butoxytriethylacetylacetonate, zirconium butoxybisethylacetylacetonate, zirconium tributoxymonoethylacetylacetonate, zirconium tetroxyethyllactate, zirconium debutoxybisethylacetate, zirconium bisacetylacetonatobisethylacetylacetonate, zirconium monoacetylacetonatotriethylacetylacetonate, zirconium monoacetylacetonatobisethylacetylacetynatobutoxy and zirconium bisacetylacetonatobisethyllactonato.

12. The composition of claim 1, wherein the release agent and the zirconium chelate compound are precombined to give a melting temperature higher than the melting temperature of the release agent.

* * * * *